Sept. 27, 1955 S. I. RAMBO ET AL 2,719,273
TUNING STUB
Filed April 8, 1950
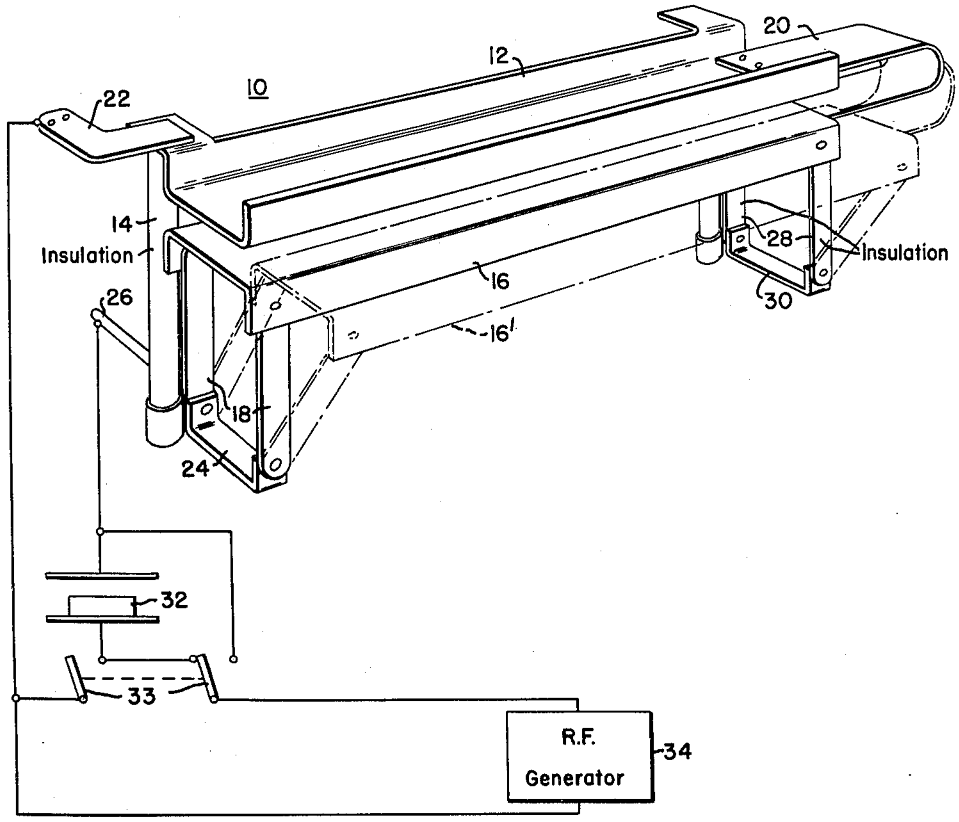
WITNESSES:
H. F. Susser.
R. G. Brodahl
INVENTORS
Sheldon I. Rambo and
Albert C. Frey.
BY
Hyman Diamond.
ATTORNEY United States Patent Office 2,719,273
Patented Sept. 27, 1955

2,719,273

TUNING STUB

Sheldon I. Rambo and Albert C. Frey, Baltimore, Md., assignors to Westinghouse Electric Corporation, East Pittsburgh, Pa., a corporation of Pennsylvania Application April 8, 1950, Serial No. 154,784

2 Claims. (Cl. 333—97)

This invention relates to the tuning of high frequency heating circuits and more particularly it relates to an adjustable inductance tuner for use in assuring proper generator loading in such circuits.

In high frequency heating circuits, and particularly those of the dielectric heating type, as the temperature of the object to be heated is increased, the electrical properties of said object to be heated change and matching provisions are necessary to assure proper generator loading and to obtain optimum power in the material to be heated. With a given power source, it is desirable and it is the current practice to tune the heater circuit by series or parallel connected tuning stub apparatus.

In accordance with the teachings of the prior art of which we are aware, tuning stubs of the trombone type using a sliding short-circuiting bar which is moved along a pair of transmission line conductors to vary the effective length of said short-circuited transmission line have been employed because of their relative simplicity and high power capacities; however, this type of tuning stub is very unsatisfactory in that the movable shorting bar is subject to rapid mechanical wear and electrical contact troubles often develop which result in objectionable arcing and eventually the total destruction of the transmission line and sliding bar. Another prior art method has been to employ variable lumped inductances to accomplish the desirable variable load tuning.

It is an object of our invention to provide a tuning stub apparatus consisting of a short-circuited transmission line having its conductors so adapted that the relative spacing therebetween can be varied to result in a variable inductance apparatus for use in tuning high current load circuits.

Another object of our invention is to provide a variable inductance tuning stub comprising a transmission line capable of handling large high frequency currents and an easily operable line spacing carrier for said transmission line which allows primarily linear spacing motion between such lines.

Still another object is to provide a tuning stub having a line spacing adjustment apparatus which requires a comparatively small physical space to give a comparatively wide range of inductive variance.

An additional object is to provide in a variable inductance tuning stub a transmission line carrier member which has a relatively small weight and physical size and a desirable design for dielectric heating applications.

A further object is to provide a tuning stub which is superior to those available in the prior art, such as variable lumped inductances or shorting slide bar types.

A still further object is to use a transmission line section as a tuning stub and impart a relatively linear spacs ing movement between the conductors of such a transmission line.

In accordance with our invention, a transmission line tuning stub having a variable inductance, by reason of its special construction, allows the spacing between its conductors to be varied. A transmission line which is less than one-quarter wave length long at the frequency of operation presents an inductive reactance. By utilizing the proper length of short-circuited transmission line tuning stubs in relation to the capacitance of the load to be tuned as taught by the applicants' invention, the effective terminating impedance presented to the power source may be made to approach more closely the ideal and desirable characteristic impedance necessary for proper generator loading and to convey optimum power into the material to be heated. In our tuning stub, one of the conductors is so mounted on a pantograph carrier that it can be moved with respect to the other conductor in a substantially linear motion to change the spacing between said conductors. As taught by our invention, the substantially linear motion is provided by means of a very easily operated and simple rotary drive, parallel motion mechanism with 90° or less of total rotation of the drive member.

In actual practice, for each heating circuit load to be tuned, different tuning problems are presented. This necessitates a tuning stub designed for each load application which considers the particular physical space limitations, current magnitudes, necessary range of inductive variance, weight of tuning stub, etc., determined thereby. The subject tuning stub apparatus will operate very satisfactorily for tuning dielectric heating load applications.

These and other objects are effected by our invention as will be apparent from the following description and claims taken in accordance with the accompanying drawing forming a part of this application, the single figure of which is a perspective view of our variable inductance tuning stub showing the pantograph arrangement for effecting the spacing between the transmission line conductors.

In the drawing, a tuning stub 10 is shown which consists of a short-circuited transmission line having a conductor 12 fixedly mounted on insulator support members 14 and another conductor 16 mounted on pivoted conductor members 18. A flexible short-circuiting connection 20 is provided between one end respectively of each conductor 12 and 16. A terminal 22 is provided at the opposite end therefrom of the fixed conductor 12 for connection to the load circuit 32 to be tuned. The other conductor 16 at one end is pivotally fastened to the two conducting arms 18 which, in turn, are pivoted to a base support member 24. These latter conducting arms 18 are firmly fastened to a rotary drive shaft member 26. The movable conducting member 16 at the end opposite where it is connected to the conducting arms 18, is pivotally fastened to two insulating support arms 28. These latter insulating support arms 28 are, in turn, pivoted to a base support member 30. The terminal member 22 fastened to the fixed conductor 12 and the rotary drive shaft 26 fastened to the conducting arms 18, which, in turn, are fastened to the movable member 16, may be employed as the two connections to be connected across the load circuit 32 to be tuned. By the broken lines on the figure, the movable conductor 16 is shown in one of its removed positions 16', with respect to the fixed conductor 12. This latter position 16' has been effected by rotation of the drive shaft member 26 to pivot the conductor arms 18 and hence move the movable conductor 16 to increase the spacing between the conducting members 12 and 16. A suitable R-F generator 34 supplies power to the load circuit 32.

In the operation of the tuning stub apparatus shown in the single figure, the tuning stub 10 is, in effect, a short-circuited transmission line having a length of less than a one-quarter wave length long, and short-circuited at one end so as to present an inductive reactance between its opposite terminals thereto. This short-circuited transmission line tuning stub 10 can be placed either in series with a dielectric load 32 to be tuned, or in parallel across said dielectric load 32 to be tuned, to provide the proper supply generator loading which is necessary to obtain optimum power in the dielectric load material. For illustrative purposes only, a switching arrangement 33 is shown in the drawing to accomplish either the series or parallel connection referred to above.

As the length of the short-circuited transmission line tuning stub 10 is shown as of a fixed value, the adjustment of the inductive reactance is accomplished by changing the spacing between the two conductors 12 and 16. This spacing is substantially changed in a linear direction by means of the parallel motion pantograph carrier apparatus shown. Actually, however, as the drive shaft 26 is rotated to change the position of the movable conductor member 16 and thereby vary the spacing between said conductors 12 and 16, the movable conductor member 16 is changed in a lateral direction as well as in a linear direction with respect to the fixed conductor 12. On the drawing is shown by broken lines the position 16' assumed by the movable conductor member 16 after the spacing between said conductors 12 and 16 has been increased from a minimum value. By rotating the drive shaft member 26 to vary the spacing between the two transmission line conductors 12 and 16, compensation can be made for changes in the dielectric properties of the material undergoing heat treatment.

Although we have illustrated our variable inductance tuning member 10 primarily as usable to tune a high frequency load dielectric heating circuit 32 for optimum power transfer, it is to be understood that it may be used in any application where a variable inductance tuning stub is desirable.

While we have shown our invention in one form only, it will be obvious to those skilled in the art that it is not so limited but is susceptible to various changes and modifications without departing from the spirit thereof, and we desire, therefore, that only such limitations shall be placed upon it as are specifically set forth in the appended claims.

We claim as our invention:

1. In a variable inductance transmission line tuning stub, the combination of at least two transmission line conductors, a support base, a first support member fixedly connected between a first of said conductors and the support base such that the first conductor is thereby fixedly positioned relative to the support base, a flexible short-circuiting member providing an electrical connection common to one end of each of said transmission line conductors, a pantograph carrier for positioning a second of said conductors parallel relative to said first conductor, said pantograph carrier including a second support member pivotally connected to the support base and to the second transmission line conductor, such that the second transmission line conductor is thereby rotatable relative to the support base, and with said short-circuiting member being operative to allow curvilinear movement of the second conductor relative to the first conductor.

2. In an adjustable inductance tuning stub apparatus, the combination of a first and a second conductor member, a support base, an electrical short-circuiting connection common to one end of each of said conductor members, and a first support member fixedly connected between the first conductor member and the support base, and a parallelogram carrier member for supporting the second conductor member in a parallel position relative to the first conductor member such that they are electrically operative as a tuning stub, said carrier member including a second support member pivotally connected to the support base and to the second conductor member, such that the second conductor member is rotatable relative to the support base and thereby movable relative to the first conductor member, with said short-circuiting connection being made of flexible material and shaped such that the latter relative movement between said first and second conductor members can be made.

References Cited in the file of this patent

UNITED STATES PATENTS

| | | |
|---|---|---|
| 1,733,974 | Nyman | Oct. 29, 1929 |
| 1,824,871 | Clarke | Sept. 29, 1931 |
| 2,203,481 | Zottu | June 4, 1940 |
| 2,412,314 | Boerner | Dec. 10, 1946 |
| 2,412,604 | Dolan | Dec. 17, 1946 |
| 2,494,596 | Vahle | Jan. 7, 1950 |
| 2,554,295 | Cooper | May 22, 1951 |
| 2,605,413 | Alvarez | July 29, 1952 |